United States Patent
Hung

(10) Patent No.: US 10,524,339 B2
(45) Date of Patent: Dec. 31, 2019

(54) SWITCH APPARATUS

(71) Applicants: LITE-ON ELECTRONICS (GUANGZHOU) LIMITED, Guangzhou (CN); Lite-On Technology Corporation, Taipei (TW)

(72) Inventor: Yi-Chun Hung, Taipei (TW)

(73) Assignees: LITE-ON ELECTRONICS (GUANGZHOU) LIMITED, Guangzhou (CN); Lite-On Technology Corporation, Taipei (TW)

(*) Notice: Subject to any disclaimer, the term of this patent is extended or adjusted under 35 U.S.C. 154(b) by 0 days.

(21) Appl. No.: 15/866,491

(22) Filed: Jan. 10, 2018

(65) Prior Publication Data

US 2019/0132935 A1  May 2, 2019

(30) Foreign Application Priority Data

Nov. 1, 2017   (CN) .......................... 2017 1 1055569

(51) Int. Cl.

| H01H 19/00 | (2006.01) |
|---|---|
| H05B 39/00 | (2006.01) |
| H05B 39/08 | (2006.01) |
| H01H 19/02 | (2006.01) |

(Continued)

(52) U.S. Cl.
CPC ......... *H05B 39/085* (2013.01); *H01H 19/025* (2013.01); *H01H 9/02* (2013.01); *H01H 9/52* (2013.01); *H01H 2231/052* (2013.01); *H01H 2239/064* (2013.01); *H03K 2217/96015* (2013.01)

(58) Field of Classification Search
CPC ...... H05B 39/00; H05B 39/08; H05B 39/085; H01H 3/00; H01H 19/02; H01H 19/025; H01H 19/04; H01H 37/02; H01H 37/04; H01H 37/32
See application file for complete search history.

(56) References Cited

U.S. PATENT DOCUMENTS 3,212,038 A * 10/1965 Herrick ................. H01F 29/025
                                                    174/480
4,803,380 A *  2/1989 Jacoby, Jr. ............... H01H 9/02
                                                    174/16.3

(Continued)

FOREIGN PATENT DOCUMENTS

JP            11340664 A  * 12/1999

*Primary Examiner* — Thai Pham
(74) *Attorney, Agent, or Firm* — JCIPRNET

(57) ABSTRACT

A switch apparatus adapted to be disposed on a wall surface includes a box, a heat generating element, a cover, a switch element, and a first heat dissipation structure. The box has an opening and is adapted to be embedded into the wall surface. The heat generating element is disposed inside the box. The cover is assembled to the box and covers the opening. The cover has a front surface and a rear surface opposite to each other. The rear surface faces toward the box, and the front surface is adapted to be exposed from the wall surface. The switch element is disposed on the front surface. The first heat dissipation structure includes first and second sections connected with each other. The first section is connected with the cover and exposed from the front surface, and the second section extends into the box and contacts the heat generating element.

14 Claims, 6 Drawing Sheets

(51) Int. Cl.
*H01H 9/52* (2006.01)
*H01H 9/02* (2006.01)

(56) References Cited

U.S. PATENT DOCUMENTS

| | | | | |
|---|---|---|---|---|
| 4,835,343 A * | 5/1989 | Graef | ................ | H02G 3/14 |
| | | | | 174/66 |
| 4,924,249 A * | 5/1990 | Aihara | ................ | G03B 17/14 |
| | | | | 396/303 |
| 4,924,349 A * | 5/1990 | Buehler | ................ | H02G 3/14 |
| | | | | 174/55 |
| 5,189,259 A * | 2/1993 | Carson | ................ | H01H 9/02 |
| | | | | 174/57 |
| 6,774,328 B2 * | 8/2004 | Adams | ................ | H05B 39/00 |
| | | | | 200/329 |
| 7,821,160 B1 * | 10/2010 | Roosli | ................ | H05B 37/0254 |
| | | | | 307/112 |
| 9,389,769 B1 * | 7/2016 | O'Keeffe | ................ | G06F 1/3262 |
| 9,608,420 B1 * | 3/2017 | Ferrara | ................ | H02G 3/14 |

* cited by examiner

SWITCH APPARATUS

CROSS REFERENCE TO RELATED APPLICATION

This application claims the priority benefit of China application serial no. 201711055569.8, filed on Nov. 1, 2017. The entirety of the above-mentioned patent application is hereby incorporated by reference herein and made a part of specification.

BACKGROUND OF THE INVENTION

1. Field of the Invention

The invention relates to a switch apparatus, and particularly relates to a switch apparatus having a dimmer.

2. Description of Related Art

Switches of indoor lighting apparatuses may be disposed on a wall surface for users to operate. Taking a switch apparatus capable of adjusting light as an example, a heat generating element, such as a silicon controlled rectifier (SCR), is commonly disposed in a junction box or a gang box of the switch apparatus. Therefore, a heat dissipation structure in an adequate size is disposed on the front side of the switch apparatus to absorb the heat generated by the heat generating element in the junction box and discharge the heat outside. However, the heat dissipation structure may excessively occupy an accommodation space at the front side of an operation area of the switch apparatus. Therefore, in the known switch apparatus capable of adjusting light formed by a one-gang box, the operation area of the switch apparatus is unable to accommodate other functional elements in addition to a dimmer.

SUMMARY OF THE INVENTION

One or some embodiments of the invention provide a switch apparatus. The switch apparatus has a desirable heat dissipation efficiency and is able to integrate a dimmer and other functional elements in an operation area corresponding to a one-gang box.

The switch apparatus according to an embodiment of the invention is adapted to be disposed on a wall surface. The switch apparatus includes a box, a heat generating element, a cover, and a first heat dissipation structure. The box has an opening and is adapted to be embedded into the wall surface. The heat generating element is disposed inside the box. The cover is assembled to the box and covers the opening. The cover has a front surface and a rear surface opposite to each other. The rear surface faces toward the box, and the front surface is adapted to be exposed from the wall surface. The switch element is disposed on the front surface. The first heat dissipation structure includes a first section and a second section connected with each other. The first section is connected with the cover and exposed from the front surface, and the second section extends into the box and contacts the heat generating element.

According to an embodiment of the invention, the cover has a notch, and the first section is fit with the notch.

According to an embodiment of the invention, the switch apparatus further includes an appearance member covering the cover. The switch element is at least a portion of the appearance member.

According to an embodiment of the invention, a plurality of heat dissipation holes is provided on an edge of the appearance member.

According to an embodiment of the invention, a length of a front end surface of the box is 101.2 millimeters, and a width of the front end surface of the box is 55.4 millimeters.

According to an embodiment of the invention, the first section has a heat dissipation surface, and the heat dissipation surface is coplanar with the front surface.

According to an embodiment of the invention, the switch apparatus further includes a control circuit board. The control circuit board is disposed inside the box, the cover has a slot, and the switch element is electrically connected to the control circuit board through the slot.

According to an embodiment of the invention, the switch apparatus further includes a second heat dissipation structure. The second heat dissipation structure is disposed inside the box, and the second section and the second heat dissipation structure respectively contact two opposite ends of the heat generating element.

According to an embodiment of the invention, the second section is bent to be in an L shape, and the heat generating element is sandwiched between the second section and the second heat dissipation structure.

According to an embodiment of the invention, the switch apparatus further includes a second heat dissipation structure. The second heat dissipation structure is disposed inside the box and in connection with the second section.

According to an embodiment of the invention, the switch element is a dimmer.

According to an embodiment of the invention, the box is a one-gang box, and the cover further includes at least one functional element on the front surface.

The switch apparatus according to an embodiment of the invention is adapted to be disposed on a wall surface. The switch apparatus includes a box, a cover, a switch element, and at least one functional element. The box has an opening and is adapted to be embedded into the wall surface. In addition, the box is a one-gang box. The cover is assembled to the box and covers the opening. The cover has a front surface and a rear surface opposite to each other. The rear surface faces toward the box, and the front surface is adapted to be exposed from the wall surface. The switch element and the at least one functional element are disposed on the front surface.

According to an embodiment of the invention, the switch apparatus further includes an appearance member covering the cover. The switch element and the at least one functional element are at least a portion of the appearance member.

According to an embodiment, the switch apparatus further includes a heat generating element and a first heat dissipation structure. The heat generating element is disposed inside the box. The first heat dissipation structure includes a first section and a second section connected with each other. The first section is connected with the cover and exposed from the front surface. The second section extends into the box and contacts the heat generating element.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings

DESCRIPTION OF THE EMBODIMENTS

Figure 1:
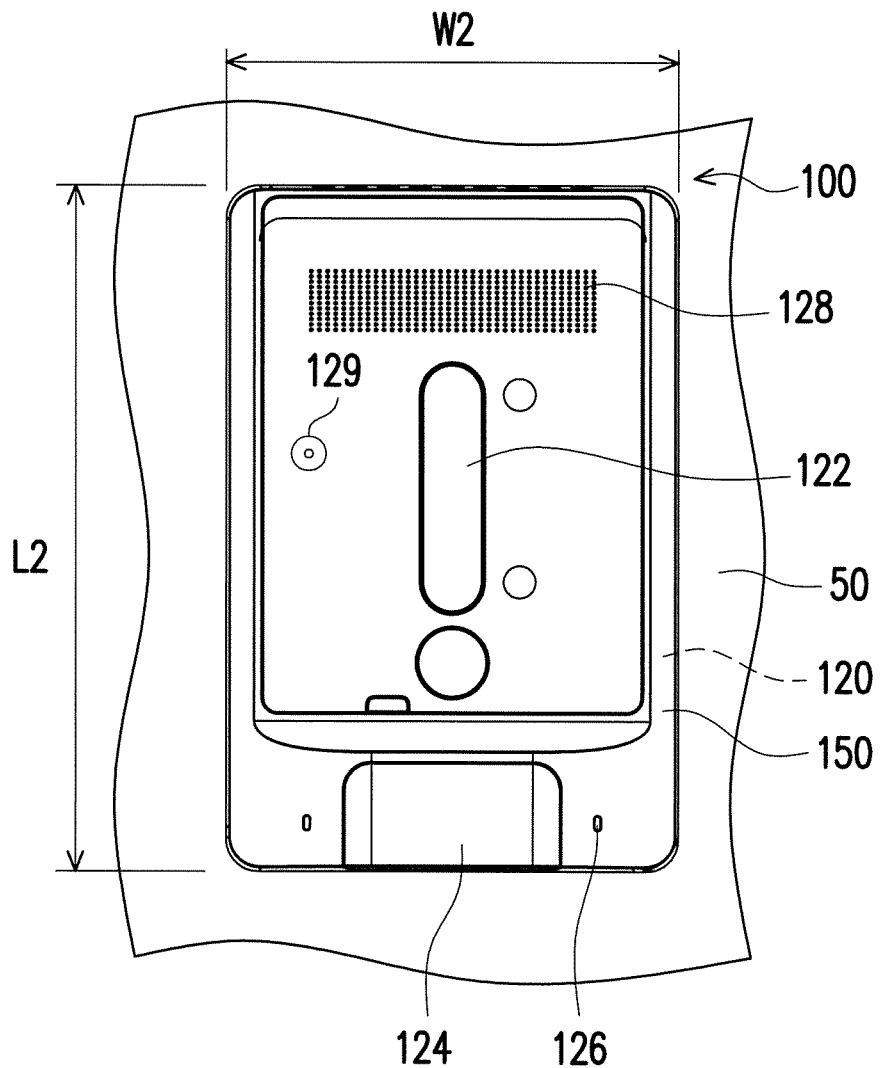
FIG. 1 is a front view illustrating a switch apparatus according to an embodiment of the invention disposed on a wall surface.

Reference will now be made in detail to the present preferred embodiments of the invention, examples of which are illustrated in the accompanying drawings. Wherever possible, the same reference numbers are used in the drawings and the description to refer to the same or like parts.

Figure 2:
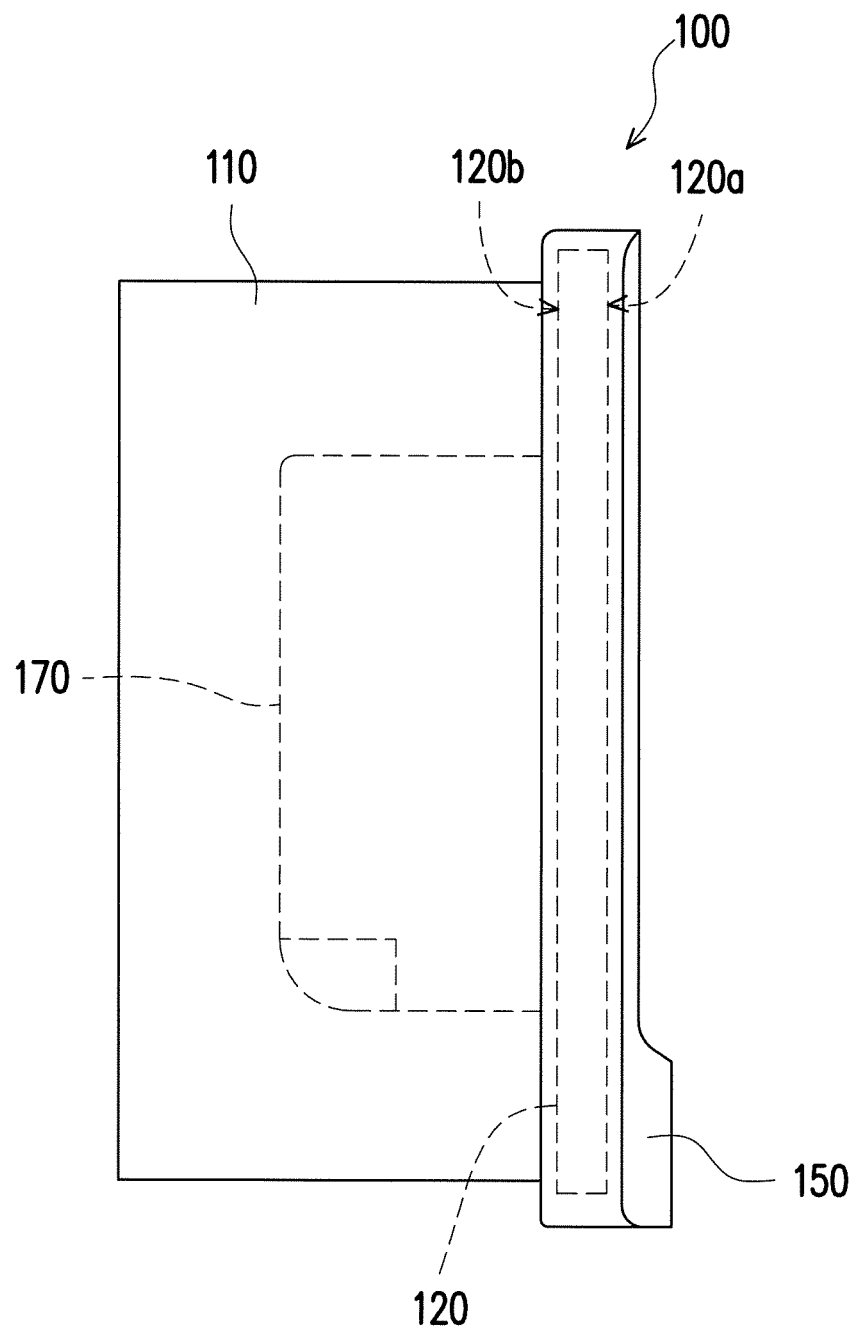
FIG. 2 is a side view illustrating the switch apparatus of FIG. 1.
Figure 3:
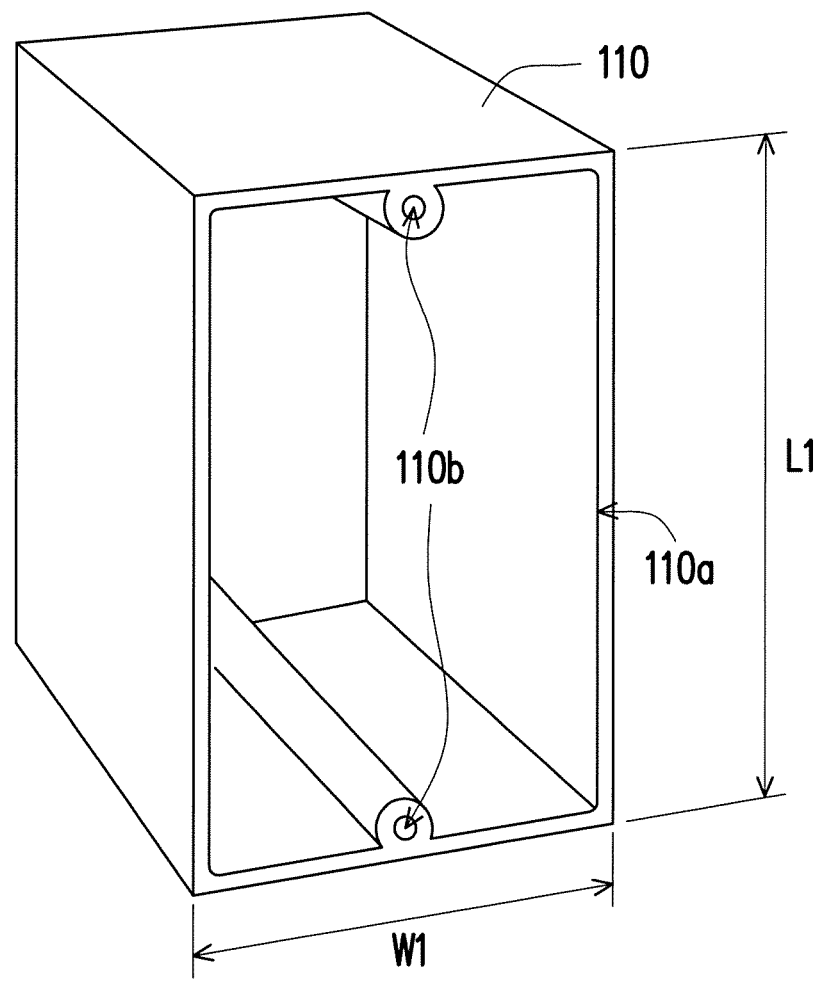
FIG. 3 is a perspective view illustrating a box of FIG. 2.

FIG. 1 is a front view illustrating a switch apparatus according to an embodiment of the invention disposed on a wall surface. FIG. 2 is a side view illustrating the switch apparatus of FIG. 1. FIG. 3 is a perspective view illustrating a box of FIG. 2. Referring to FIGS. 1 to 3, a switch apparatus 100 of the embodiment is adapted to be disposed on a wall surface 50. The switch apparatus 100 includes a box 110 and a cover 120. The box 110 has an opening 110a and is adapted to be embedded into the wall surface 50. The cover 120 is assembled to the box 110 and covers the opening 110a of the box 110. The cover 120 has a front surface 120a and a rear surface 120b. The front surface 120a of the cover 120 is adapted to be exposed from the wall surface 50, and the rear surface 120b of the cover 120 faces toward the box 110. The switch apparatus 100 further includes a switch element 122. The switch element 122 is a touch dimmer switch element, for example, and is disposed on the front surface 120a of the cover 120. The cover 120 of the embodiment is covered by an appearance member 150, for example, to provide a desirable appearance, and the switch element 122 is a portion of the appearance member 150, for example. Specifically, the switch, element 122 may be integrally formed on the appearance member 150, or may be fit with the appearance member 150 non-integrally. The invention does not intend to impose a limitation on this regard.

Figure 4:
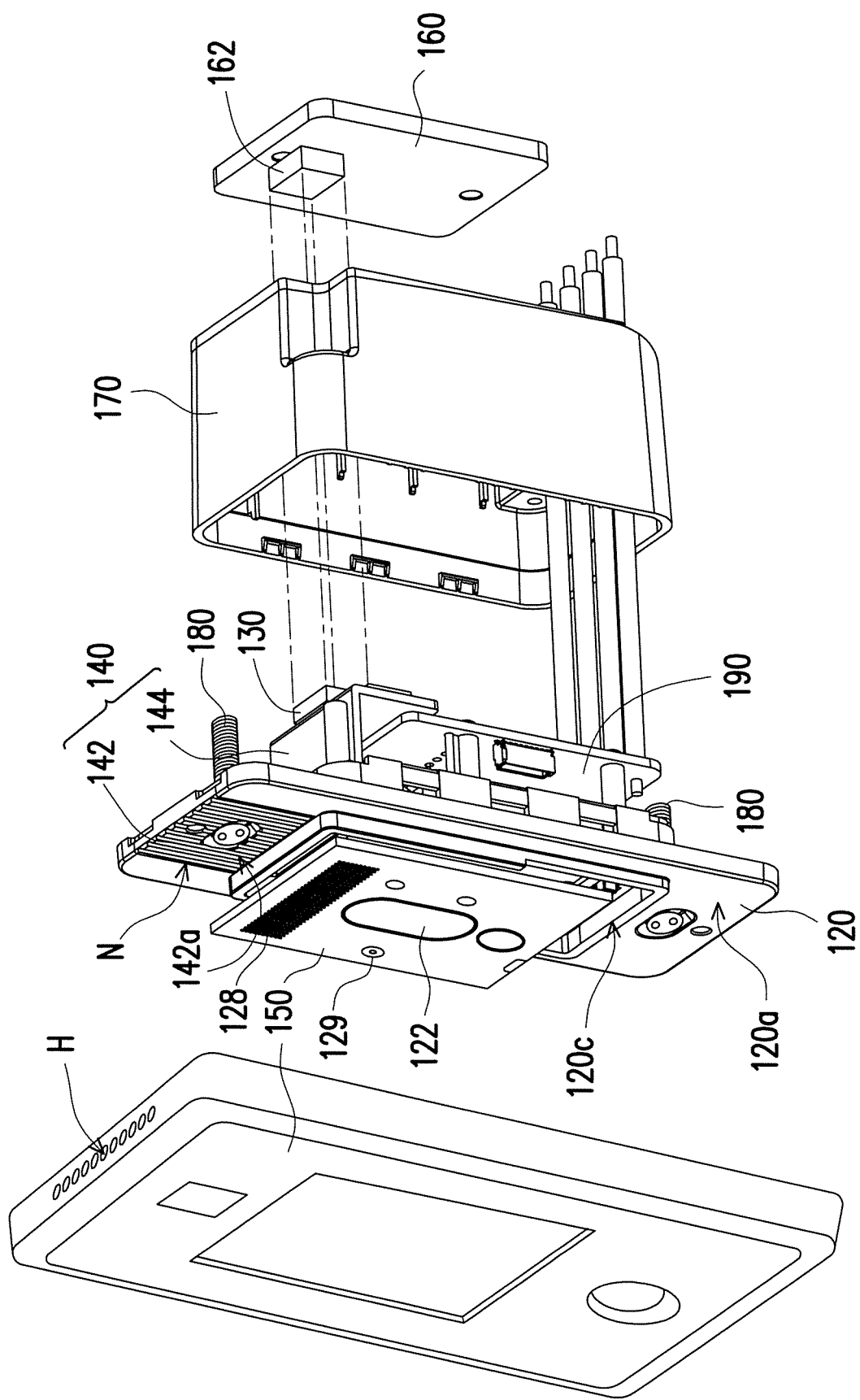
FIG. 4 is an exploded view illustrating some components of the switch apparatus of FIG. 1.
Figure 5:
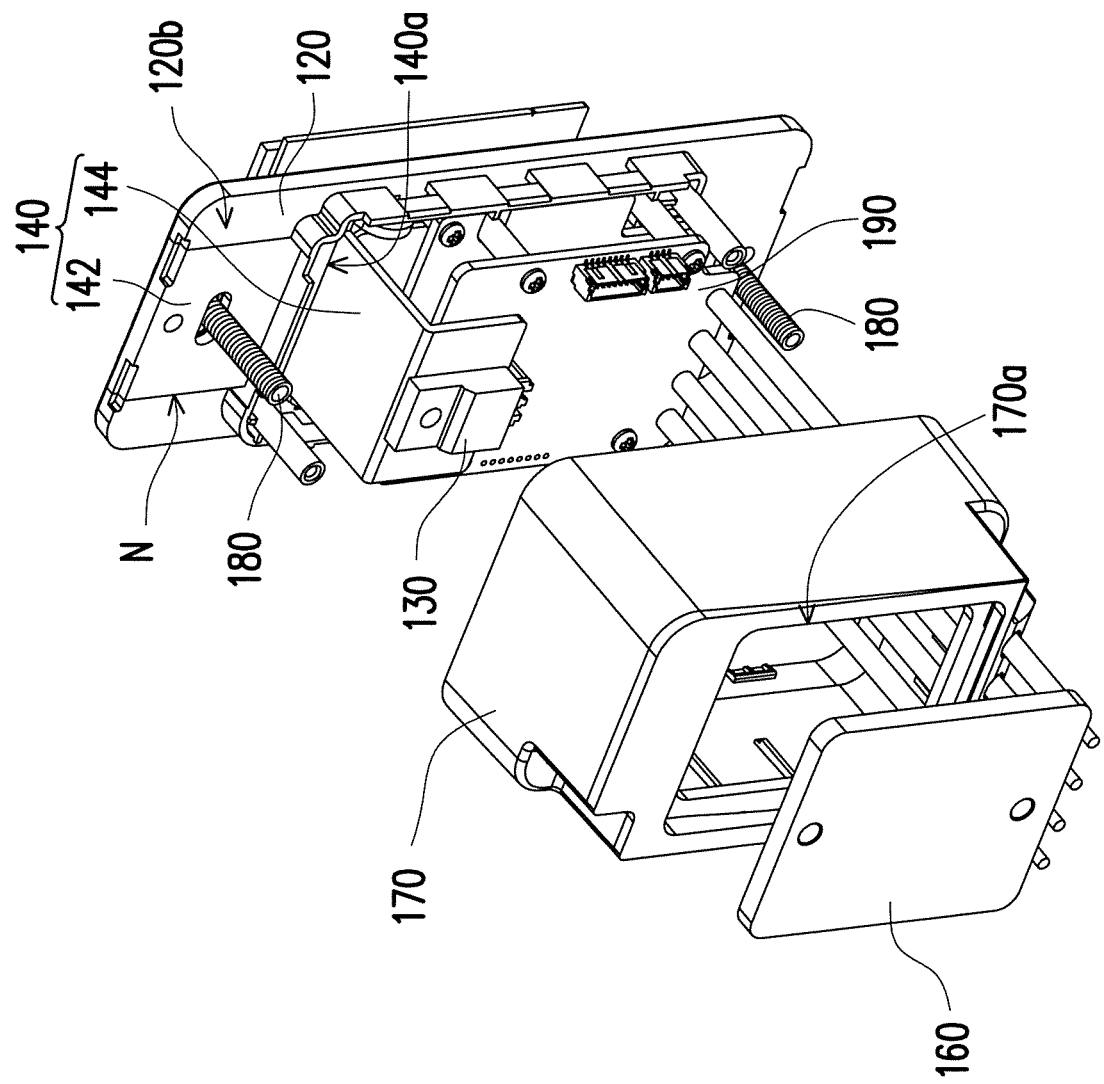
FIG. 5 is an exploded view illustrating some components of the switch apparatus of FIG. 1 from another perspective.

FIG. 4 is an exploded view illustrating some components of the switch apparatus of FIG. 1. FIG. 5 is an exploded view illustrating some components of the switch apparatus of FIG. 4 from another perspective. Referring to FIGS. 4 and 5, the switch apparatus 100 according to the embodiment further includes a heat generating element 130 and a first heat dissipation structure 140. The heat generating element 130 is a silicon controlled rectifier, for example, and disposed inside the box 110. The first heat dissipation structure 140 includes a first section 142 and a second section 144 connected with each other at an interface 140a shown in FIG. 5. In addition, an angle (e.g., 90 degrees) is included between the first section 142 and the second section 144, so the first section 142 and the second section 144 form a three-dimensional structure. The first section 142 is connected to the cover 120, exposed from the front surface 120a of the cover 120, and covered by the appearance member 150. In addition, the first section 142 is connected to the cover 120 through an in-mold insert molding process, for example. However, the invention is not limited thereto. The second section 144 extends into the cover 110 and contacts the heat generating element 130. The material of the first section 142 and the second section 144 of the first heat dissipation structure 140 includes a metal material having a high coefficient of thermal conductivity, for example, whereas the material of the cover 120 includes a plastic material having a lower coefficient of thermal conductivity, for example.

With the configuration, the first heat dissipation structure 140 is able to further dissipate heat of the heat generating element 130 through the second section 144 inside the box 110 in addition to dissipating the heat of the heat generating element 130 through the first section 142 exposed from the front surface 120a of the cover 120. Therefore, even though the first section 142 of the first heat dissipation structure 140 does not occupy most area of the front surface 120a of the cover 120 and has a relatively smaller size, the first heat dissipation structure 140 is still reinforced by the second section 144 thereof. Accordingly, the heat generated by the heat generating element 130 is able to be efficiently absorbed by the first section 142 and the second section 144 and discharged outside through the first section 142. Hence, the switch apparatus 100 has a desirable heat dissipation efficiency.

More specifically, the box 110 of the embodiment is a one-gang box. Since the first section 142 of the first heat dissipation structure 140 does not occupy most area of the front surface 120a of the cover 120, other functional elements (such as a motion sensor 124, a microphone 126, a speaker 128, and a camera lens 129 shown in FIG. 1) may be additionally disposed on the front surface 120a of the cover 120. Therefore, the switch apparatus 100 formed by a one-gang box is able to integrate a plurality of functions. The motion sensor 124 serves to sense whether there is anyone approaching the switch apparatus 100, for example, to reinforce security or to adjust light automatically. The microphone 126 and the speaker 128 allow the switch apparatus 100 to provide a communication function, and the camera lens 129 allows the switch apparatus 100 to provide an image capturing function. In other embodiments, other types of functional elements may be disposed on the front surface 120a of the cover 120. The invention does not intend to impose a limitation on this regard. In addition, when an antenna is disposed in the switch apparatus 100 to transmit/receive signals (e.g., transmitting an external control signal to the switch apparatus 100), the signal transmission/reception of the antenna is not affected due to the smaller size of the first section 142. The antenna is adapted for an electronic apparatus, such as a cell phone, to transmit/receive a wireless signal to/from the switch apparatus 100.

The one-gang box refers to a junction box with public regulations (also referred to as a switch box or a control box). According to the public regulations, a length L1 of a front end surface of the box 110 is 101.2 millimeters, and a width W1 of the front end surface of the box 110 is 55.4 millimeters. Dimensions of the cover 120 are greater than or equal to the dimensions of the front end surface of the box 110. In addition, dimensions of the appearance member 150 are greater than the dimensions of the cover 120. In the embodiment, a length L2 of the appearance member 150 is 128 millimeters, for example, and a width W2 of the appearance member 150 is 84 millimeters, for example. In the embodiment, the front end surface of the box 110 is aligned to the wall surface 50, for example, the cover 120 is slightly protruding from the wall surface 50, and the appearance member 150 is more protruding from the wall surface 150. However, the invention is not limited thereto.

As shown in FIGS. 4 and 5, the cover 120 has a notch N, and the first section 142 of the first heat dissipation structure 140 is fit with the notch N. The first section 142 of the first heat dissipation structure 140 has a heat dissipation surface 142a. The heat dissipation surface 142a is coplanar with the front surface 120a of the cover 120. Accordingly, the front surface 120a of the cover 120 is provided with a sufficient area to dispose the functional elements. The invention does not intend to limit the area of the heat dissipation surface 142a of the first section 142. The area of the heat dissipation surface 142a may be properly adjusted based on needs in addition to the size of coverage on the body 120 shown in FIG. 4.

Referring to FIGS. 4 and 5, the cover 120 is fastened to fastening holes 110b of the box 110 shown in FIG. 3 through two fasteners 180. Specifically, one of the two fasteners 180 penetrates the cover 120, and the other of the two fasteners 180 penetrates the first section 142 of the first heat dissipation structure 140. In other embodiments, the cover 120 may be assembled to the box 110 in other suitable ways. The invention does not intend to impose a limitation on this regard.

In the embodiment, the switch apparatus 100 further includes a second heat dissipation structure 160 as shown in FIGS. 4 and 5. The second heat dissipation structure 160 is disposed in the box 110 (shown in FIG. 2). The second section 144 of the first heat dissipation structure 140 and the second heat dissipation structure 160 respectively contact two opposite ends of the heat generating element 130. Accordingly, the heat generated by the heat generating element 130 is able to be quickly discharged out from the heat generating element 130 through the first heat dissipation structure 140 and the second heat dissipation structure 160, so as to avoid over-heating of the heat generating element 130. In addition, the second heat dissipation structure 160 contacts the heat generating element 130 via a thermal paste 162 on the second heat dissipation structure 160, for example. In the embodiment, the cover 170 is adapted to cover the heat generating element 130. A control circuit board 190 of the switch apparatus 100 is disposed in the box 110 and also covered by the cover 170. The second heat dissipation structure 160 is disposed at a rear side of the cover 170 and contacts the heat generating element 130 via an opening 170a of the cover 170. The second heat dissipation structure 160 may be fixed through fastening or other appropriate means. The invention does not intend to impose a limitation on this regard.

As shown in FIG. 4, the cover 120 of the embodiment has a slot 120c. Accordingly, the switch element 122 and the functional elements are able to be electrically connected with the control circuit board 190 via the slot 120c. In other embodiments, the cover 120 may also omit the slot 120c. The invention does not intend to impose a limitation on this regard.

As shown in FIG. 4, a plurality of heat dissipation holes H is provided on an edge of the appearance member 150 to further facilitate the heat dissipation efficiency of the switch apparatus 100. In other embodiments, another suitable number of the heat dissipation holes H may also be formed at another suitable position of the appearance member 150. The invention does not intend to impose a limitation on this regard.

In the embodiment, the second section 144 of the first heat dissipation structure 140 is bent to be in an L shape, as shown in FIGS. 4 and 5. Accordingly, the heat generating element 130 vertically arranged may be sandwiched between the second section 144 of the first heat dissipation structure 140 and the second heat dissipation structure 160.

Figure 6:
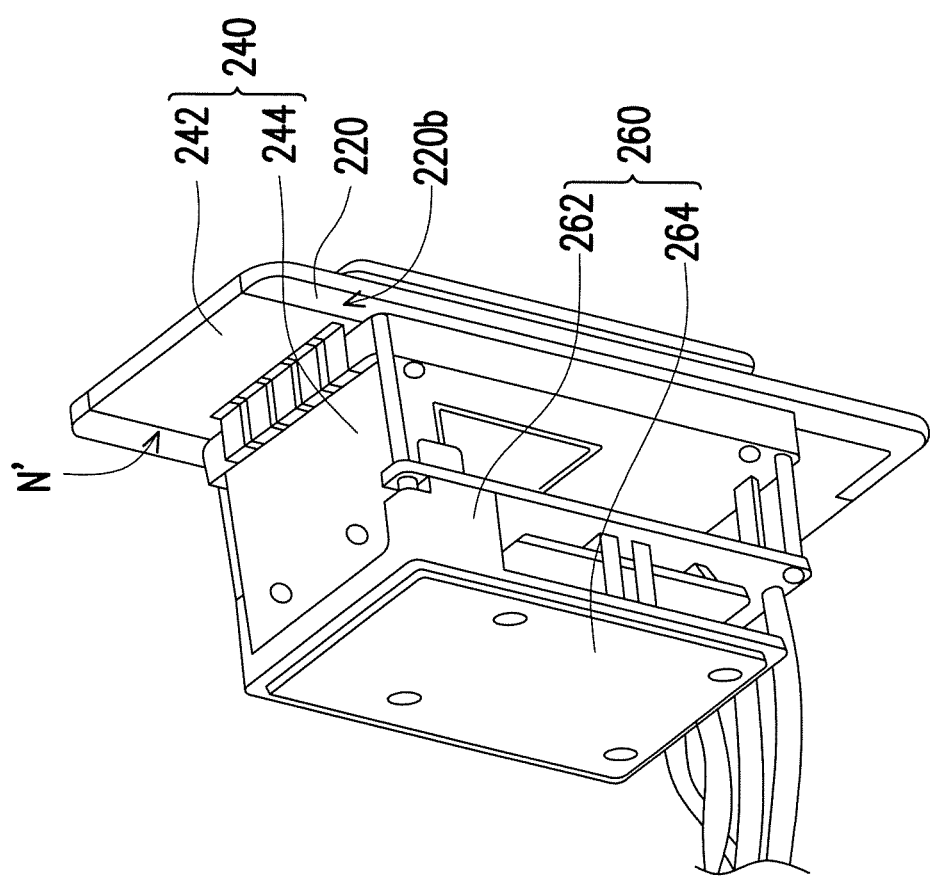
FIG. 6 is a perspective view illustrating some components of the switch apparatus according to another embodiment of the invention.

FIG. 6 is a perspective view illustrating some components of the switch apparatus according to another embodiment of the invention. Arrangements and functions of a cover 220, a rear surface 220b, a notch N', a first heat dissipation structure 240, a first section 242, a second section 244, and a second heat dissipation structure 260 of the embodiment shown in FIG. 6 are similar to those of the cover 120, the rear surface 120b, the notch N, the first heat dissipation structure 140, the first section 142, the second section 144, and the second heat dissipation structure 160. Thus, details in these regard will not be repeated in the following. What differs in the embodiment shown in FIG. 6 is that the second section 244 of the first heat dissipation structure 240 is not L-shaped. The second section 244 is in connection with the second heat dissipation structure 260. Accordingly, the heat of the second heat dissipation structure 260 may be directly transferred to the second section 244 and discharged outside to the external via the first section 242. In addition, the second heat dissipation structure 260 includes a connection part 262 and an extension part 264. The second section 244 is in connection with the connection part 262, and the extension part 264 is integrally connected with the connection part 262 and extends downward.

In view of the foregoing, in the embodiments of the invention, the first heat dissipation structure is able to further dissipate the heat of the heat generating element through the second section inside the box in addition to dissipating the heat of the heat generating element through the first section exposed from the front surface of the cover. Therefore, when the first section of the first heat dissipation structure does not occupy most area of the front surface of the cover and has a relatively smaller size, the first heat dissipation structure may still expand and be enlarged through the second section of the first heat dissipation structure. Accordingly, the heat generated by the heat generating element is able to be efficiently absorbed by the first section and the second section and discharged outside through the first section. Therefore, the switch apparatus has a desirable heat dissipation efficiency. More specifically, the first heat dissipation structure is a three-dimensional structure, and a part of the first heat dissipation structure (such as the second section) extends backward from the front surface of the cover. Therefore, the first heat dissipation structure does not occupy a majority of the area on the front surface of the cover. Only a portion of the area on the front surface of the cover is occupied by the first section of the first heat dissipation structure, and the area of the first section may be adjusted. Since the first section of the first heat dissipation structure does not occupy most area of the front surface of the cover, other functional elements (such as a motion sensor, a microphone, a speaker, or a camera lens) may be additionally disposed on the front surface of the cover. Therefore, the switch apparatus formed by a one-gang box is able to integrate a plurality of functions.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A switch apparatus, adapted to be disposed on a wall surface, wherein the switch apparatus comprises:

a box, having an opening and adapted to be embedded into the wall surface;

a heat generating element, disposed inside the box;

a cover, assembled to the box and covering the opening, wherein the cover has a front surface and a rear surface opposite to each other, the rear surface faces toward the box, and the front surface is adapted to be exposed from the wall surface;

a switch element, disposed on the front surface; and a first heat dissipation structure, comprising a first section and a second section connected with each other, wherein the first section is connected with the cover and exposed from the front surface, and the second section extends into the box and contacts the heat generating element.

2. The switch apparatus as claimed in claim 1, wherein the cover has a notch, and the first section is fit with the notch.

3. The switch apparatus as claimed in claim 1, further comprising an appearance member covering the cover, wherein the switch element is at least a portion of the appearance member.

4. The switch apparatus as claimed in claim 3, wherein a plurality of heat dissipation holes is provided on an edge of the appearance member.

5. The switch apparatus as claimed in claim 1, wherein a length of a front end surface of the box is 101.2 millimeters, and a width of the front end surface of the box is 55.4 millimeters.

6. The switch apparatus as claimed in claim 1, wherein the first section has a heat dissipation surface, and the heat dissipation surface is coplanar with the front surface.

7. The switch apparatus as claimed in claim 1, further comprising a control circuit board, wherein the control circuit board is disposed inside the box, the cover has a slot, and the switch element is electrically connected to the control circuit board through the slot.

8. The switch apparatus as claimed in claim 1, further comprising a second heat dissipation structure, wherein the second heat dissipation structure is disposed inside the box, and the second section and the second heat dissipation structure respectively contact two opposite ends of the heat generating element.

9. The switch apparatus as claimed in claim 8, wherein the second section is bent to be in an L shape, and the heat generating element is sandwiched between the second section and the second heat dissipation structure.

10. The switch apparatus as claimed in claim 1, further comprising a second heat dissipation structure, wherein the second heat dissipation structure is disposed inside the box and in connection with the second section.

11. The switch apparatus as claimed in claim 1, wherein the switch element is a dimmer.

12. The switch apparatus as claimed in claim 1, wherein the box is a one-gang box, and the cover further comprises at least one functional element on the front surface.

13. A switch apparatus, adapted to be disposed on a wall surface, wherein the switch apparatus comprises:

a box, having an opening and adapted to be embedded into the wall surface, wherein the box is a one-gang box;

a cover, assembled to the box and covering the opening, wherein the cover has a front surface and a rear surface opposite to each other, the rear surface faces toward the box, and the front surface is adapted to be exposed from the wall surface; a switch element and at least one functional element, disposed on the front surface; and a heat generating element and a first heat dissipation structure, wherein the heat generating element is disposed inside the box, and the first heat dissipation structure is connected to the heat generating element and the cover, wherein the first heat dissipation structure comprises a first section and a second section connected with each other, the first section is disposed on the cover and has a heat dissipation surface, and the heat dissipation surface is at least partially exposed from the front surface and coplanar therewith, wherein the second section is bent to be in an L shape and contacts the heat generating element.

14. The switch apparatus as claimed in claim 13, further comprising an appearance member covering the cover, wherein the switch element and the at least one functional element are at least a portion of the appearance member.

* * * * *